(12) United States Patent
Moon et al.

(10) Patent No.: US 6,410,345 B1
(45) Date of Patent: Jun. 25, 2002

(54) METHOD FOR MANUFACTURING A FERROELECTRIC MEMORY DEVICE

(75) Inventors: Won Moon; Jeong-Ho Cho, both of Ichon-shi (KR)

(73) Assignee: Hynix Semiconductor, Inc., Ishon-shi (KR)

( * ) Notice: Subject to any disclaimer, the term of this patent is extended or adjusted under 35 U.S.C. 154(b) by 0 days.

(21) Appl. No.: 09/975,086

(22) Filed: Oct. 12, 2001

(30) Foreign Application Priority Data

May 11, 2001 (KR) ........................................ 2001-25726

(51) Int. Cl.[7] .............................................. H01L 21/00
(52) U.S. Cl. ............................................................ 438/3
(58) Field of Search ............................ 438/3, 800, 381, 438/386–392, 393–395, 396–399

(56) References Cited

U.S. PATENT DOCUMENTS 5,864,932 A * 2/1999 Evans et al. ................ 29/25.42

OTHER PUBLICATIONS

Robert E. Jones, Jr., Ferroelectric nonvolatile memories for embedded applications, 1998 IEEE Custom Integrated Circuits Conference, pp. 431–438.

Yamazaki et al., Advanced 0.5um FRAM Device Technology with . . . , 1997 IEEE.

Lee et al., A FRAM technology using 1T1C and triple metal . . . , Aug. 1999.

* cited by examiner

Primary Examiner—Craig Thompson
(74) Attorney, Agent, or Firm—Jacobson Holman, PLLC (57) ABSTRACT

A ferroelectric memory device manufacturing method capable of improving topology between a ferroelectric memory device and a logic device. The method for manufacturing the ferroelectric memory device includes steps of: a) forming an insulating layer on a semiconductor substrate; b) opening a capacitor region by selectively patterning the insulating layer; c) forming a bottom electrode in the opened capacitor region by using a chemical vapor deposition (CVD) method; d) forming a ferroelectric layer on a subsequent insulating layer including the bottom electrode; e) filling the ferroelectric layer on the capacitor region to a same height as that of the subsequent insulating layer surface; and f) forming a top electrode on the ferroelectric layer.

8 Claims, 6 Drawing Sheets

METHOD FOR MANUFACTURING A FERROELECTRIC MEMORY DEVICE

FIELD OF THE INVENTION

The present invention relates to a method for manufacturing a semiconductor device having a merged ferroelectric memory device and logic device and, more particularly, to a ferroelectric memory device manufacturing method capable of improving a topology between a ferroelectric memory device and a logic device.

DESCRIPTION OF THE PRIOR ART

In a semiconductor memory device using a ferroelectric material in a capacitor, several studies have been developed in an effort to overcome the limits of refresh in a conventional dynamic random access memory (DRAM) and to achieve large capacitance. A ferroelectric random access memory (FeRAM) is one of the nonvolatile memory devices that can store information in a powered-down downstate and has an operating speed comparable to that of the conventional DRAM.

A ferroelectric layer, such as $SrBi_2Ta_2O_9$ (hereinafter, referred to as an SBT) or $Pb(Zr, Ti)O_3$ (hereinafter, referred to as a PZT), is usually used as a capacitor dielectric in a FeRAM device. The ferroelectric layer, which is employed in a nonvolatile memory device, has a dielectric constant in a range of a few hundreds to a few thousands, and has two stabilized remnant polarization (Pr) states. The nonvolatile memory device, which uses the ferroelectric layer, has a hysteresis characteristic and inputs a digital signal "1" or "0" therein by changing an orientation of polarization according to an electric field applied to the ferroelectric layer, and stores the digital signal using a remnant polarization.

When a ferroelectric layer, such as a $Sr_xBi_y(Ta_zNb_j)_2O_9$ (hereinafter, referred to as an SBTN) layer, has been used besides the PZT and the SBT, then top/bottom electrodes are selected from the group consisting of Pt, Ir, Ru IrO, RuO and Pt-alloy.

In case of a merged FeRAM logic (MFeL) which merges the FeRAM and a logic device, the following process for the logic device is carried out in a smaller design rule than a normal memory manufacturing process. Therefore, after forming a capacitor, a large topology may be generated between the memory device where the capacitor is formed and the logic device. A planarization process is usually used to solve the above-mentioned problem.

Figure 1:
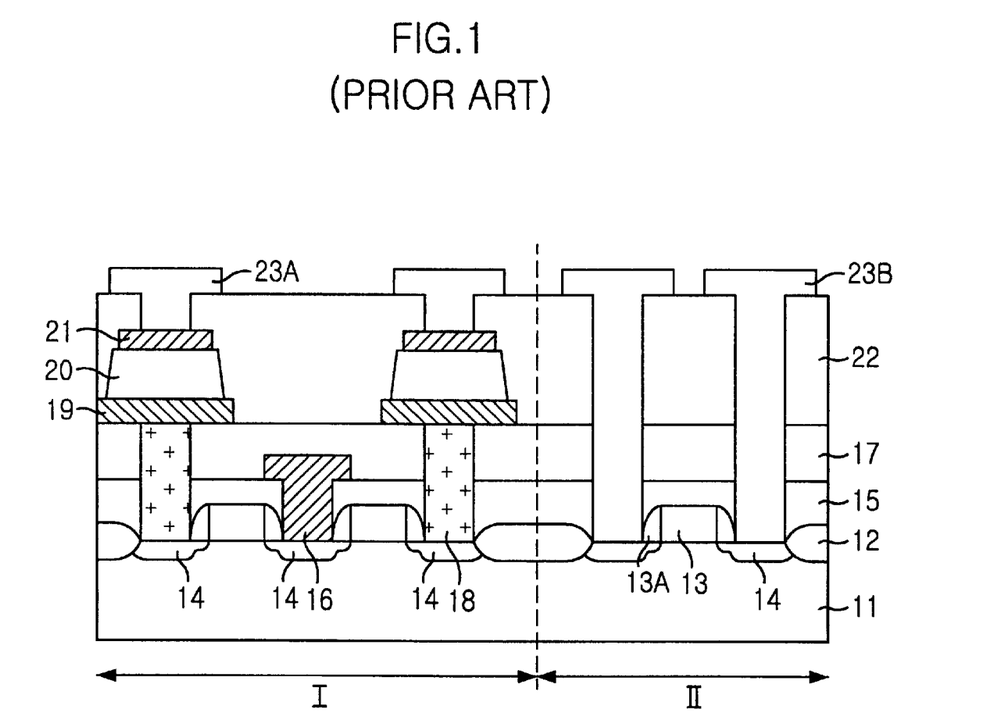
FIG. 1 is a cross-sectional view illustrating a conventional MFeL device.

FIG. 1 is a cross-sectional view illustrating a conventional merged FeRAM logic (MFeL) device. In a conventional MFeL manufacturing method, a field oxide layer 12 is formed in a predetermined portion of a semiconductor substrate 11 to separate a memory region (I) and a logic region (II), and gate electrodes 13 are formed on the semiconductor substrate 11 by depositing and patterning a polysilicon layer.

Source/drain regions 14 are formed in the semiconductor substrate 11 by inserting high density dopants therein by using the word line as a mask and a first interlayer insulating layer 15 is formed on the resulting structure of the semiconductor substrate 11. At this time, the source/drain regions 14 are formed in each of the memory region. (I) and the logic region (II), and sidewall spacers 13A are formed on each sidewall of the gate electrodes 13. The source/drain regions 14 are formed in a lightly doped drain (LDD) structure.

Next, a memory device manufacturing process is carried out in the memory region (I). A first interlayer insulating layer 15 is formed on the resulting structure of the memory device, and bit line contact holes, which expose a portion of the many source/drain regions 14, are formed by selectively patterning the interlayer insulating layer 15. A bit line 16 is formed on the resulting structure including the bit line contact hole by depositing and patterning a second polysilicon layer.

Subsequently, a second interlayer insulating layer 17 is formed on the resulting structure including the bit line 16. Plug contact holes, which expose the source/drain regions 14 of the memory region (I) except that part connected to the bit line 16, are formed by selectively patterning the second interlayer insulating layer 17. Polysilicon plugs 18 buried in the plug contact holes are formed.

As above-described, the polysilicon plugs are usually formed by depositing a third polysilicon layer and burying it in a predetermined depth of a plug contact hole using an etch back process.

Then, a barrier metal structure of $TiN/TiSi_2$ may be formed on the polysilicon plug 18. First, a TiN/Ti layer is formed on the polysilicon plugs 18 by depositing the material on the resulting structure and carrying out a thermal process to induce reaction of a Ti material on a Si material. The resulting $TiSi_2$ layer forms an ohmic contact between the polysilicon plugs 18 and a subsequently formed bottom electrode.

Subsequently, a bottom electrodes 19, ferroelectric layers 20 and top electrodes 21 are successively stacked up on the second interlayer insulating layer 17 including the polysilicon plugs 18. Then, a capacitor is formed by carrying out a dry etching.

Finally, a third interlayer insulating layer 22 is deposited on the resulting structure, and metal interconnection holes which expose the top electrode 21 of the capacitor are also formed by selectively etching the third interlayer insulating layer 22. At this time, the metal interconnection holes which expose the source/drain regions 14 in the logic region (II) are also formed by successively etching the third interlayer insulating layer 22, the second interlayer insulating layer 17 and the first interlayer insulating layer 15. Subsequently, metal wirings 23A and 23B, which are connected to the top electrodes 21 and the source/drain regions of the logic region (II) through each contact hole, are formed.

As above-described, in the high density ferroelectric memory device using a capacitor on bit line (COB) structure, the capacitors are formed on the plugs formed by a polysilicon.

However, when performing a dry etching process to form the capacitor, the ferroelectric layers 20 are etched with a declining width, so that a thickness of the ferroelectric layers are hardly being consistent, and there exists the limits in downsizing a capacitor.

The ferroelectric characteristic may also be decreased by a loss generated during dry etching. Moreover, when forming the third interlayer insulating layer 22 on the resulting structure after forming the capacitors, a height of the interlayer insulating layer 22 in the memory region (I) will be higher than that in the logic region (II). Consequently, a planarization process should be carried out in the following process.

SUMMARY OF THE INVENTION

It is, therefore, an object of the present invention to provide a ferroelectric memory device manufacturing method capable of overcoming the drawbacks of a dry etching of a bottom electrode to prevent a loss caused by dry etching, and obtain a uniform ferroelectric layer.

In accordance with an aspect of the present invention, there is provided a method for manufacturing a ferroelectric memory device, comprising steps of: a) forming an insulating layer on a semiconductor substrate; b) opening a capacitor region by selectively patterning the insulating layer; c) forming a bottom electrode in the opened capacitor region by using a chemical vapor deposition (CVD) method; d) forming a ferroelectric layer on an insulating layer including the bottom electrode; e) filling the ferroelectric layer on the capacitor region to a same height as that of the insulating layer surface; and f) forming a top electrode on the ferroelectric layer.

In accordance with another aspect of the present invention, there is provided a method for manufacturing a ferroelectric memory device, comprising steps of: a) forming an insulating layer on a semiconductor substrate; b) opening a bottom electrode region of a capacitor by selectively patterning the insulating layer; c) forming a bottom electrode on the opened bottom electrode region by selectively using a chemical vapor deposition (CVD) method; d) partly filling the bottom electrode region by forming a ferroelectric layer only on the bottom electrode; and forming a top electrode on the ferroelectric layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, a ferroelectric memory device manufacturing method in accordance with the present invention will be described in detail referring to the accompanying drawings.

FIGS. 2A to 2E are cross-sectional views showing a MFeL device manufacturing method in accordance with a first embodiment of the present invention.

Figure 2A:
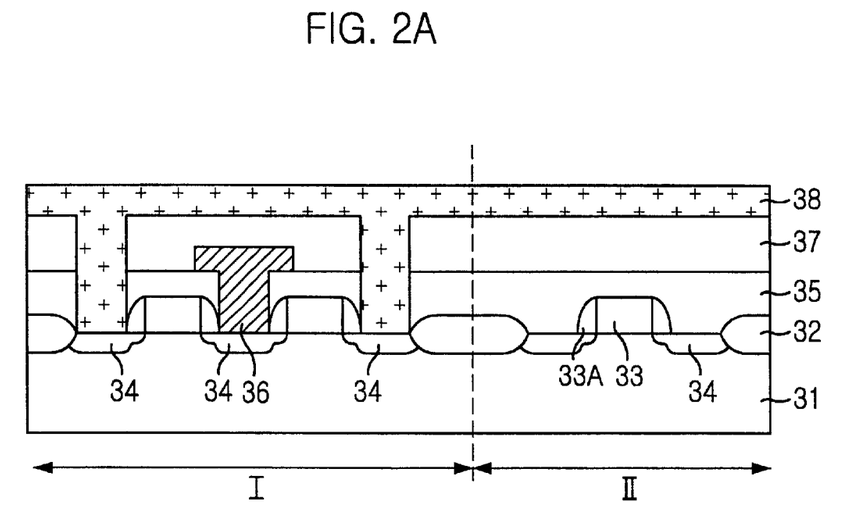
FIGS. 2A to 2E are cross-sectional views showing a MFeL device manufacturing method in accordance with a first embodiment of the present invention.

Referring to FIG. 2A, a field oxide layer 32 is formed on a predetermined region of a semiconductor substrate 31 in a memory region (I) and a logic region (II). A plurality of word lines 33 (or gate electrodes) are formed on the semiconductor substrate 31 by depositing and patterning a first polysilicon.

Next, a plurality of source/drain regions 34 are formed in the semiconductor substrate 31 by implanting high-density dopants into the semiconductor substrate 31 by using the word line 33 as a mask and a first interlayer insulating layer 35 is formed on the resulting structure of the semiconductor substrate 31. At this time, all the source/drain regions 34, and the word lines 33 are formed in both the memory region (I) and the logic region (II). Sidewall spacers 33A are formed on each sidewall of the word line 33 and the source/drain regions 34 are formed in a lightly doped drain (LDD) structure.

In manufacturing the memory device in the memory region (I), bit line contact holes, which expose a portion among the many source/drain regions 34, are formed by selectively patterning a first interlayer insulating layer 35. Bit lines 36 are formed on the resulting structure, including the bit line contact holes, by depositing and patterning a second polysilicon.

Next, a second interlayer insulating layer 37 is formed on the resulting structure including the bit lines 36, and contact holes, which expose the source/drain regions 34 except under the bit lines 36, are formed by selectively patterning the first and second interlayer insulating layers 35 and 37.

Subsequently, a conductive layer 38 is deposited on the resulting structure including the contact holes. At this time, the conductive layer 38 is a polysilicon or tungsten layer. Also, the conductive layer 38 may have a usual plug structure.

Figure 2B:
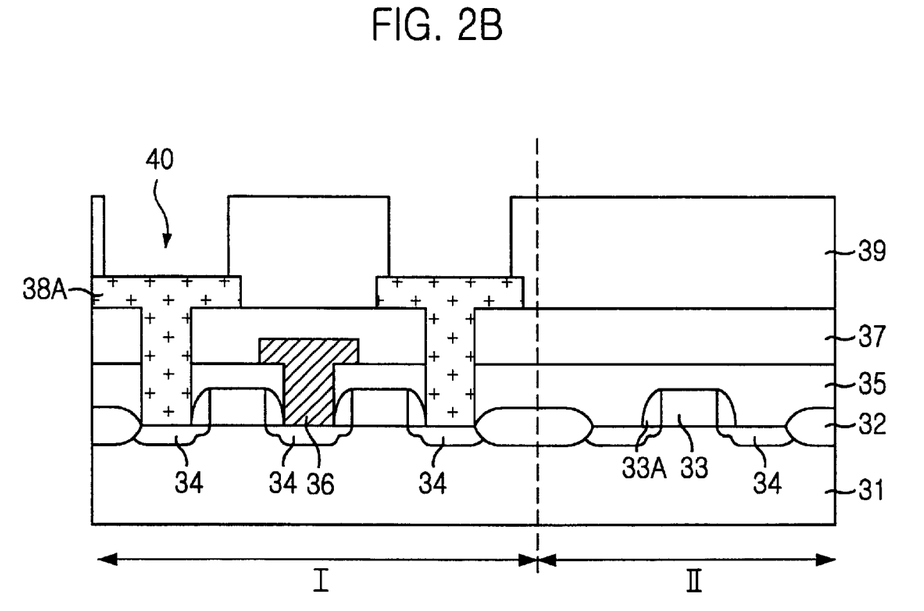

Referring to FIG. 2B, bottom electrode contact plugs 38A are formed by selectively patterning the conductive layer 38, and a third interlayer insulating layer 39 is deposited on the resulting structure including the bottom electrode contact plugs 38A. At this time, the third interlayer insulating layer 39 is an insulating layer which determines the height of the capacitor, so an oxide layer, especially a $SiO_2$ layer, is deposited at a thickness of 3000 Å to 10000 Å by using a plasma deposition method.

Next, the third interlayer insulating layer 39 is dry etched to expose a predetermined portion of the bottom electrode contact plugs 38A, so that a bottom electrode forming portion 40 is exposed.

Figure 2C:
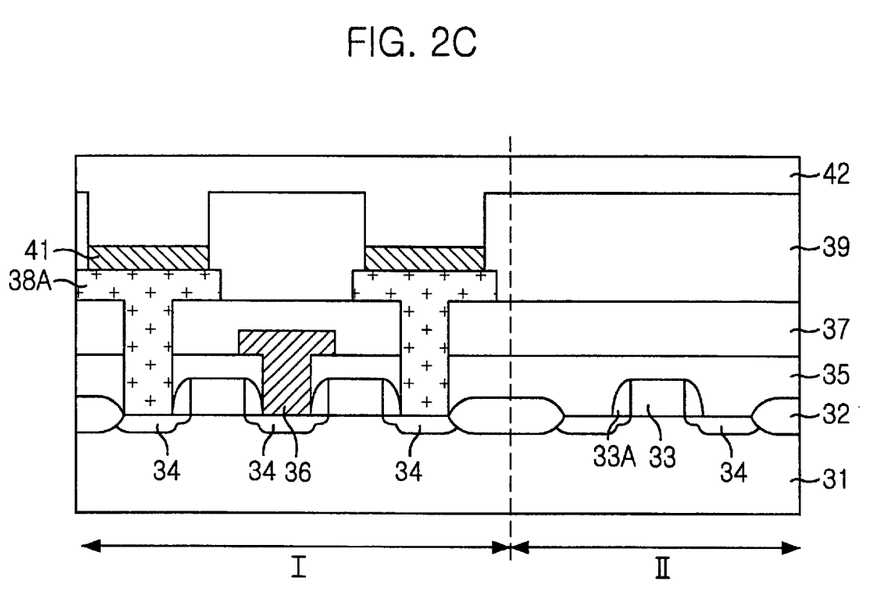

Referring to FIG. 2C, bottom electrodes 41 are deposited using a selective chemical vapor deposition (CVD) method at a thickness of 1000 Å to 1500 Å only on the bottom electrode contact plugs 38A. Next, a ferroelectric layer 42 is deposited on the resulting structure at a thickness of 2000 Å to 9000 Å by using a sol-gel method. At this time, a bottom electrode 41 is any one selected from the group consisting of Pt, Ir, Ru, $RuO_2$, $IrO_2$ and Pt-alloy materials. The ferroelectric layer 42 may be selected from $SrBi_2Ta_2O_9$ (SBT) and $Pb(Zr, Ti)O_3$ (PZT).

Figure 2D:
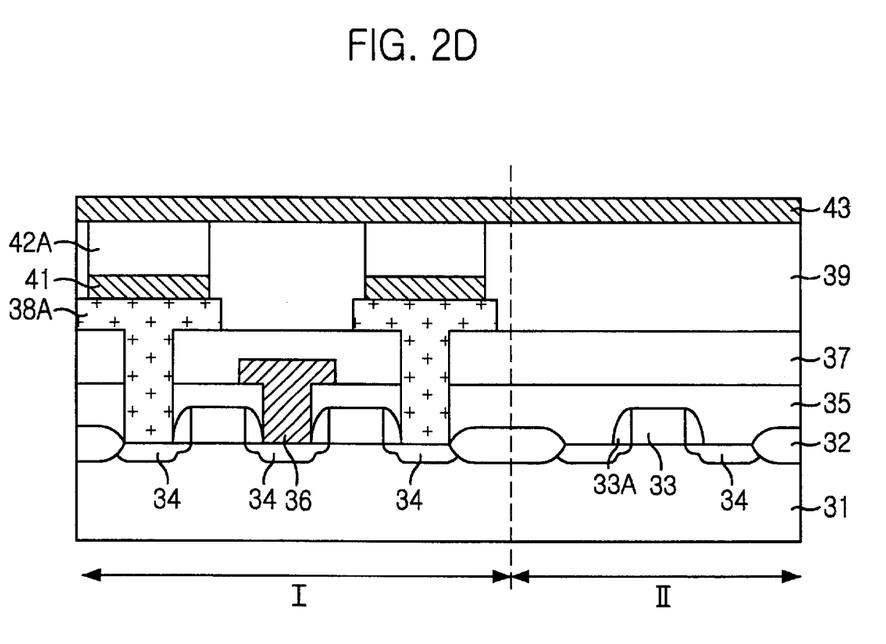

Referring to FIG. 2D, a ferroelectric layer 42A is formed as the only remnant on the bottom electrode by removing the ferroelectric layer from the other regions, except for the bottom electrode region by using an etch back or a chemical mechanical polishing (CMP) process. At this time, an etched part of the third interlayer insulating layer 39, that is, the ferroelectric layer 42A remains so as to entirely fill the capacitor region and has a structure stacked up on the bottom electrode 41.

Subsequently, a top electrode material layer 43 is deposited on the third interlayer insulating layer 39, including the ferroelectric layers 42A, by using the sputtering method.

Figure 2E:
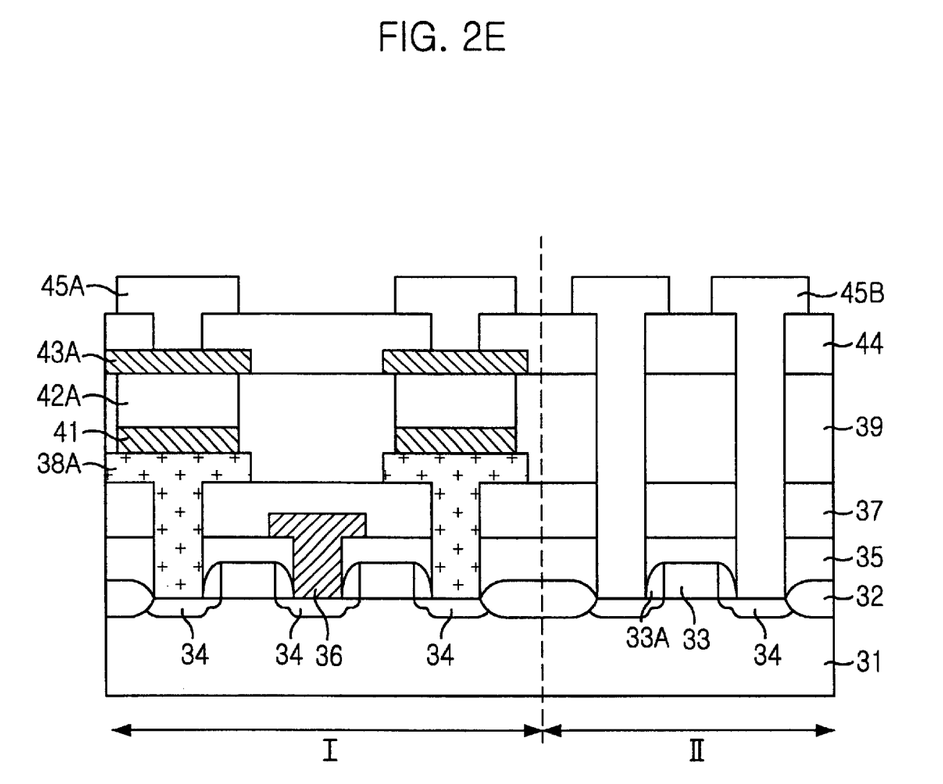

Referring to FIG. 2E, the top electrodes 43A, which have relatively large width compared with that of the ferroelectric layers 42A, are formed on the ferroelectric layers 42A by selectively dry etching the top electrode material layer 43.

At this time, top electrodes 43A are any one selected from the group consisting of Pt, Ir, Ru, $RuO_2$, $IrO_2$ and Pt-alloy materials. Typically, the top electrode 43A is formed at a thickness of 1000 Å to 2500 Å.

Next, a fourth interlayer insulating layer 44 is deposited on the resulting structure including the top electrode 43A, and metal interconnection holes, which exposes a partial surface of the top electrode 43A, are formed by selectively etching the fourth interlayer insulating layer 44. At this time, in the logic region (II), contact holes, which expose source/drain regions 34 of a logic device, are formed by selectively etching the fourth interlayer insulating layer 44, the third interlayer insulating layer 39, the second interlayer insulating layer 37 and the first interlayer insulating layer 35.

Finally, a metal layer is deposited on the resulting structure including the two kinds of openings and metal wirings 45A and 45B, which are connected to the top electrode 43A and the source/drain regions 34 of the logic device through the openings are formed by selective patterning.

In the above-described embodiment, the bottom electrode is formed by using the selective chemical vapor deposition (CVD) method and the ferroelectric layer is deposited on the bottom electrode by using a sol-gel method. Also, the ferroelectric layer remains only on the bottom electrode by using the etch back or the chemical mechanical polishing (CMP) method. Because of the above mentioned method, the bottom electrode and the ferroelectric layer may not be defined at the same time and a thickness of a ferroelectric layer may be freely regulated according to the height of the capacitor region.

Figure 3A:
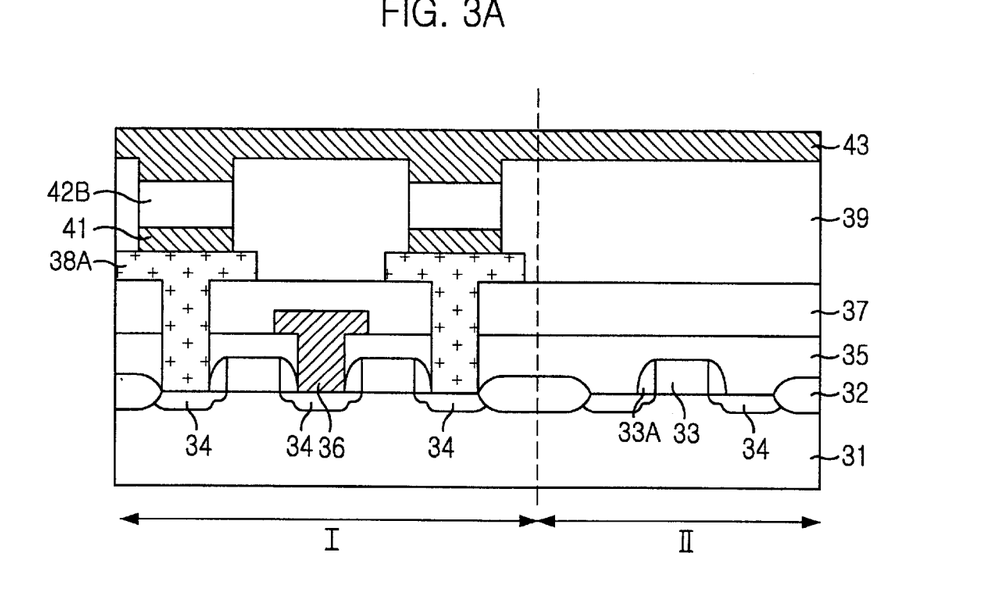
FIGS. 3A and 3B are cross-sectional views showing a MFeL device manufacturing method in accordance with a second embodiment of the present invention.
Figure 3B:
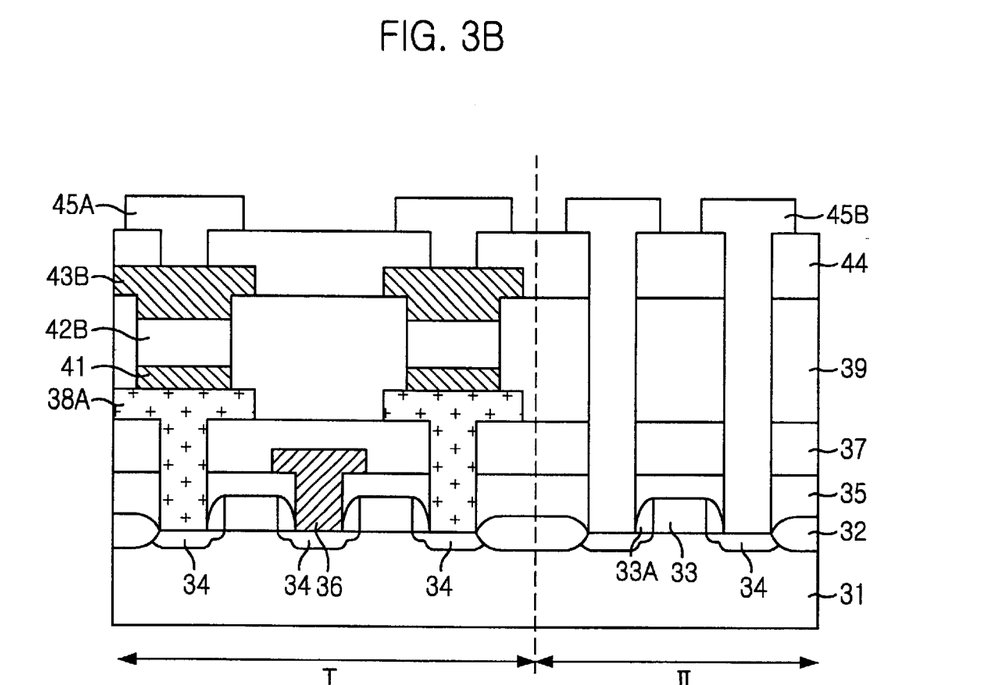

FIGS. 3A and 3B are cross-sectional views showing a MFeL device manufacturing method in accordance with a second embodiment of the present invention.

The process of ferroelectric layer manufacturing according to the second embodiment is initially carried out in the same way as that described in the above-mentioned embodiment.

To begin, referring again to FIGS. 2A to 2C, the word lines 33, the source/drain regions 34 and the bit lines 36 are formed in the memory region (I) and the logic region (II) as shown. Next, bottom electrode contact plugs 38A connected to the source/drain regions 34 of the memory region (I) are formed. After that the bottom electrodes 41 are deposited only on the bottom electrode contact plugs 38A, by using a selective chemical vapor deposition (CVD) method.

Subsequently, referring to FIG. 3A, ferroelectric layers 42B are deposited only on the bottom electrode by using a selective chemical vapor deposition (CVD) method, not using a sol-gel method as in the aforementioned embodiment.

That is, in contrast with the complete filling of the bottom electrode forming portion 40 formed in the third interlayer insulating layer 39 of FIG. 2B, the ferroelectric layers 42B are deposited in a way so as to fill a predetermined depth of the etched forming portion 40 by using a selective chemical vapor deposition (CVD). At this time, the SBT or the PZT is used as the ferroelectric layer.

Next, the top electrode material layer 43 is deposited on the resulting structure by using any one of metals selected from the group consisting of Pt, Ir, Ru IrO, RuO and Pt-alloy.

Referring to FIG. 3B, top electrodes 43B are formed by selectively patterning the top electrode material layer 43. At this time, the top electrodes 43B, which are separated from each other, are connected to the full width of the ferroelectric layer 42B.

Next, the fourth interlayer insulating layer 44 is formed on the resulting structure including the top electrodes 43B, and metal interconnection holes which expose surfaces of the top electrodes 43B are formed by selectively etching the fourth interlayer insulating layer 44. After that, contact holes, which expose the source/drain regions 34 of the logic device, are formed by selectively etching the fourth interlayer insulating layer 44, the third interlayer insulating layer 39, the second interlayer insulating layer 37 and the first interlayer insulating layer 35 in the logic region (II).

Subsequently, a metal is deposited on the resulting structure including the two kinds of holes and metal wires 45A and 45B, which are connected to the top electrode 43B and the source/drain regions 34 of the logic device through a contact hole, are formed.

Figure 4:
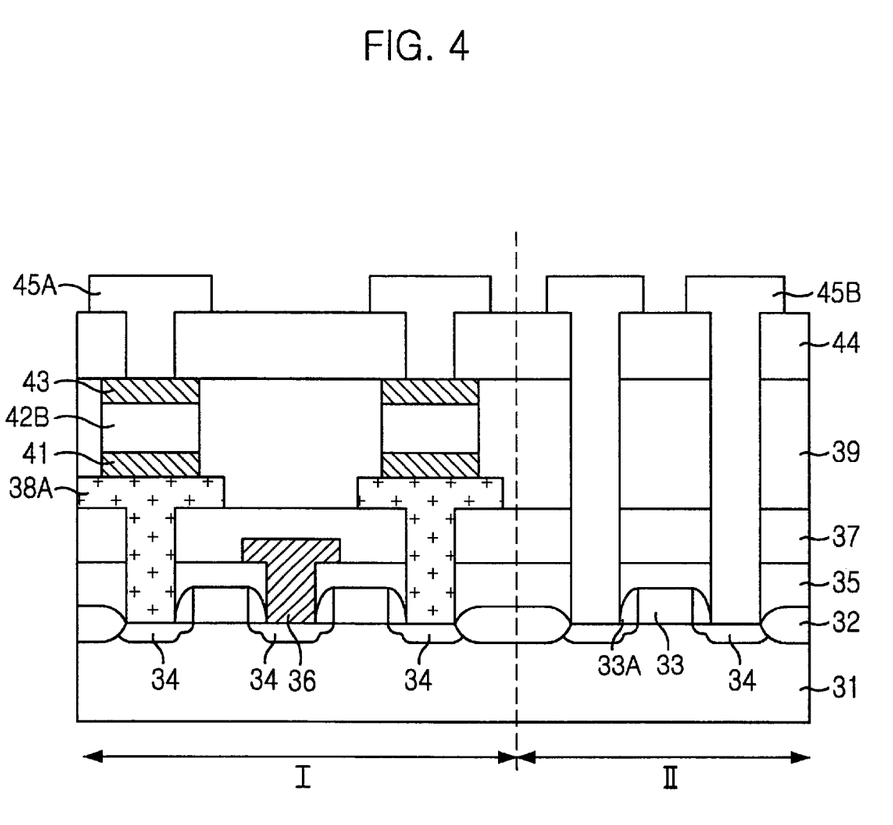
FIG. 4 is a cross-sectional view showing a MFeL device manufacturing method in accordance with a third embodiment of the present invention.

FIG. 4 is a cross-sectional view showing a MFeL device manufacturing method in accordance with a third embodiment of the present invention.

The process of ferroelectric layer manufacturing according to the third embodiment is initially carried out in the same way as that described in the above-mentioned first and second embodiments (referring to FIGS. 2A to 2C).

First, the word lines 33, the source/drain regions 34 and the bit line 36 are formed in the memory region (I) and the logic region (II) as shown. The bottom electrode contact plugs 38A connected to the source/drain regions 34 of the memory region (I) are formed and, only on the bottom electrode contact plugs 38A, the bottom electrodes 41 are deposited by using the selective chemical vapor deposition (CVD) method.

Next, a ferroelectric layer 42B is deposited only on the bottom electrode by using the selective chemical vapor deposition (CVD) method in the same way as in the second embodiment. After that, the top electrodes 43 are deposited by using the chemical vapor deposition (CVD) method only on the ferroelectric layers 42B to form capacitors completely filling the capacitor region.

Subsequently, the fourth interlayer insulating layer 44 is formed on the resulting structure including the top electrodes 43, and metal interconnection contact holes, which expose surfaces of the top electrodes 43 are formed by selectively etching the fourth interlayer insulating layer 44. Then, the metal interconnection contact holes, which expose the source/drain regions 34 of the logic device, are formed by selectively etching the fourth interlayer insulating layer 44, the third interlayer insulating layer 39, the second interlayer insulating layer 37 and the first interlayer insulating layer 35 in the logic region (II).

Finally, a metal layer is deposited on the resulting structure including the two kinds of holes and the metal wires 45A and 45B connected to the top electrodes 43 and the source/drain regions 34 of the logic device through the contact holes are formed by a selective patterning.

As described in the first, second and third embodiments, the capacitor in accordance with the present invention is formed that has a bottom electrode and a ferroelectric layer, or a bottom electrode/a ferroelectric layer/a top electrode in a filling structure so that a post planarization process is not required.

The ferroelectric memory device manufacturing method of the present invention forms a bottom electrode and a ferroelectric layer with a filling structure to generate a topology only in a top electrode, so that a planarization process may be omitted in a post process, and the whole manufacturing process is simplified. Also, a dry etching process of a ferroelectric layer, which forms a capacitor, is not carried out which prevents deterioration of the ferroelectric layer. Likewise, the equality in the thickness of the ferroelectric layer is increased by regulating such thickness through the use of an insulating layer. In addition, because a bottom electrode, a top electrode and a ferroelectric layer are not defined simultaneously, a capacitor downsizing is possible, thereby increasing the productivity of a device.

While the present invention has been described with respect to the particular embodiments, it will be apparent to those skilled in the art that various changes and modifications may be made without departing from the scope of the invention as defined in the following claims.

What is claimed is:

1. A method for manufacturing a ferroelectric memory device, comprising steps of:
   a) forming a first insulating layer on a semiconductor substrate;
   b) opening a capacitor region by selectively patterning the first insulating layer;
   c) forming a bottom electrode in the opened capacitor region by using a chemical vapor deposition (CVD) method;
   d) forming a ferroelectric layer on a second insulating layer including the bottom electrode;
   e) filling the ferroelectric layer on the capacitor region to a same height as that of the second insulating layer surface; and
   f) forming a top electrode on the ferroelectric layer.

2. The method of claim 1, wherein a ferroelectric filling step into the bottom electrode region is carried out by etch back of the ferroelectric layer or carrying out a chemical mechanical polishing (CMP).

3. The method of claim 1, wherein the step of forming top electrode includes steps of:
   forming a top electrode material on a resulting structure including the ferroelectric layer; and
   forming the top electrode with a large width to cover all the ferroelectric layer by selectively etching the top electrode material.

4. The method of claim 1, wherein the second insulating layer is formed to a thickness of 3000 Å to 10000 Å by using a plasma deposition method.

5. A method for manufacturing a ferroelectric memory device, comprising steps of:
   a) forming an insulating layer on a semiconductor substrate;
   b) opening a bottom electrode region of a capacitor by selectively patterning the insulating layer;
   c) forming a bottom electrode on the opened bottom electrode region by selectively using a chemical vapor deposition (CVD) method; and
   d) partly filling the bottom electrode region by forming a ferroelectric layer only on the bottom electrode; and
   e) forming a top electrode on the ferroelectric layer.

6. The method of claim 5, wherein in the top electrode formation step, forming the top electrode on a resulting structure includes partly filling the ferroelectric layer and then selectively patterning the top electrode, or carrying out a selective chemical vapor deposition (CVD) only on the partly filled ferroelectric layer.

7. The method of claim 5, before forming the insulating layer, further includes the step of forming a conductive contact that connects the semiconductor substrate and the bottom electrode.

8. The method of claim 1, wherein the method further comprises a step of forming a conductive contact that connects the semiconductor substrate and the bottom electrode before forming the second insulating layer.

* * * * *